United States Patent

Lai et al.

[11] Patent Number: 5,833,483
[45] Date of Patent: Nov. 10, 1998

[54] ZIF PGA SOCKET

[75] Inventors: Ching-ho Lai, Tao-Yuan Hsien; Wen-Chun Pei, Taipei, both of Taiwan

[73] Assignee: Hon Hai Precision Ind. Co., Ltd., Taipei Hsien, Taiwan

[21] Appl. No.: 859,953

[22] Filed: May 21, 1997

[30] Foreign Application Priority Data

May 21, 1996 [TW] Taiwan ................................ 85207511

[51] Int. Cl.$^6$ ...................................................... H01R 4/50
[52] U.S. Cl. ............................................. 439/342; 439/259
[58] Field of Search .................................. 439/342, 341, 439/259–289

[56] References Cited

U.S. PATENT DOCUMENTS

| | | | |
|---|---|---|---|
| 4,420,205 | 12/1983 | Kirkman | 439/342 |
| 4,531,792 | 7/1985 | Oshitani et al. | 439/342 |
| 4,988,310 | 1/1991 | Bright et al. | 439/342 |
| 5,370,549 | 12/1994 | Lee | 439/342 |
| 5,658,160 | 8/1997 | Lai | 439/342 |

FOREIGN PATENT DOCUMENTS

| | | |
|---|---|---|
| 81104728 | 12/1992 | Taiwan . |
| 83201751 | 8/1994 | Taiwan . |
| 83212046 | 2/1995 | Taiwan . |
| 84203379 | 9/1995 | Taiwan . |
| 83216239 | 12/1995 | Taiwan . |
| 83208394 | 11/1996 | Taiwan . |
| 83214436 | 12/1996 | Taiwan . |

*Primary Examiner*—Hien Vu

[57] ABSTRACT

A ZIF connector (10) includes a base (303), a cover (100) and an actuation device (200) wherein a rotation bar of the actuation device (200) includes at least an engagement slot (215) for receiving an external tool (30) therein to actuate the cover (100) with the attached CPU (20) thereon to move back-and-forth and thus to engage or disengage the pins of the CPU component with or from the corresponding contacts of the socket connector (10) whereby such external tool (30) may be removed from the engagement slot (215) after the movement of the cover (100), and therefore no lever of the actuation device is required, thus saving the available space on the PC board on which the connector is mounted.

4 Claims, 3 Drawing Sheets

ZIF PGA SOCKET

BACKGROUND OF THE INVENTION

1. Field of The Invention

The invention relates to a ZIF PGA socket, and particularly to a ZIF PGA socket operated by means of an exterior tool.

2. The Related Art

Zero insertion force (ZIF) connectors are desired because a high density contact arrangement of a connector results in a larger insertion force which may damage the inserted pins of the CPU and the corresponding contacts of the socket connector. The implementation of ZIF inserts pins of the CPU into the socket without any insert force and spaced away from the corresponding contacts in the socket. At a later time, the CPU is moved horizontally to another specific position, and the inserted pins then engage the corresponding contacts in the same passageways of the socket connector, respectively.

Taiwan patent application Nos. 81104728, 83201751, 83212046, 83208394, 84203379, 83216239, and 83214436 generally disclose the basic types of ZIF PGA sockets including a cover, a base and actuation device wherein the cover is attached to the base for moving the attached CPU component. Disposed in the base are a plurality of contacts of which one end is engaged with the inserted pins of the CPU component, and another end is soldered to the circuits of the PC board. The actuation device includes an exposed lever and an embedded rotation bar wherein the rotation bar is joined with the lever at one end, and the bar further includes plural cam sections or crank shaft sections. When the lever is vertical in a right angle position with regard to the base, the pins of the CPU component can be inserted into an socket under a ZIF condition. Successively, the operator manually pushes the lever downward to the horizontal position, the cam sections or the crank shaft sections of the rotation bar bring the cover with the attached CPU component thereof to move horizontally, and the pins of the CPU component engage with the corresponding contacts of the socket.

In contrast, when the lever is moved from zero degrees (horizontal position) back to ninety degrees (vertical position), the cover may be moved horizontally in a reverse direction. Therefore, the engagement between the contacts of the socket and the corresponding pins of the CPU component may be released, and the CPU component can be detached from the socket.

When the lever is positioned in a horizontal position, some space on the PC board will be occupied because the lever is close to the PC board under this situation. Which wastes space on the PC board. From another viewpoint, there are many electrical components near the lever, thus resulting in inconvenience to operatively access the lever.

Therefore, an object of the invention is to provide an improved mechanism of a ZIF connector without a lever for an actuation device which still allows for actuating the cover with the attached CPU component thereon to move back-and-forth in the front-to-end direction for engagement or disengagement of the pins of the CPU component and the corresponding contacts under a zero insertion force arrangement.

Another object of the invention is to provide an improved mechanism of the a ZIF connector which allows the user to actuate the cover of the connector with an external tool.

SUMMARY OF THE INVENTION

According to an aspect of the invention, a ZIF connector includes a base, a cover and an actuation device wherein a rotation bar of the actuation device includes at least an engagement slot for receiving an external tool therein to actuate the cover with the attached CPU thereon to move back-and-forth and thus to engage or disengage the pins of the CPU component with or from the corresponding contacts of the socket connector whereby such external tool may be removed from the engagement slot after the movement of the cover, and therefore no lever of the actuation device is required, thus saving the available space on the PC board on which the connector is mounted.

DETAILED DESCRIPTION OF THE PREFERRED EMBODIMENTS

Figure 1:
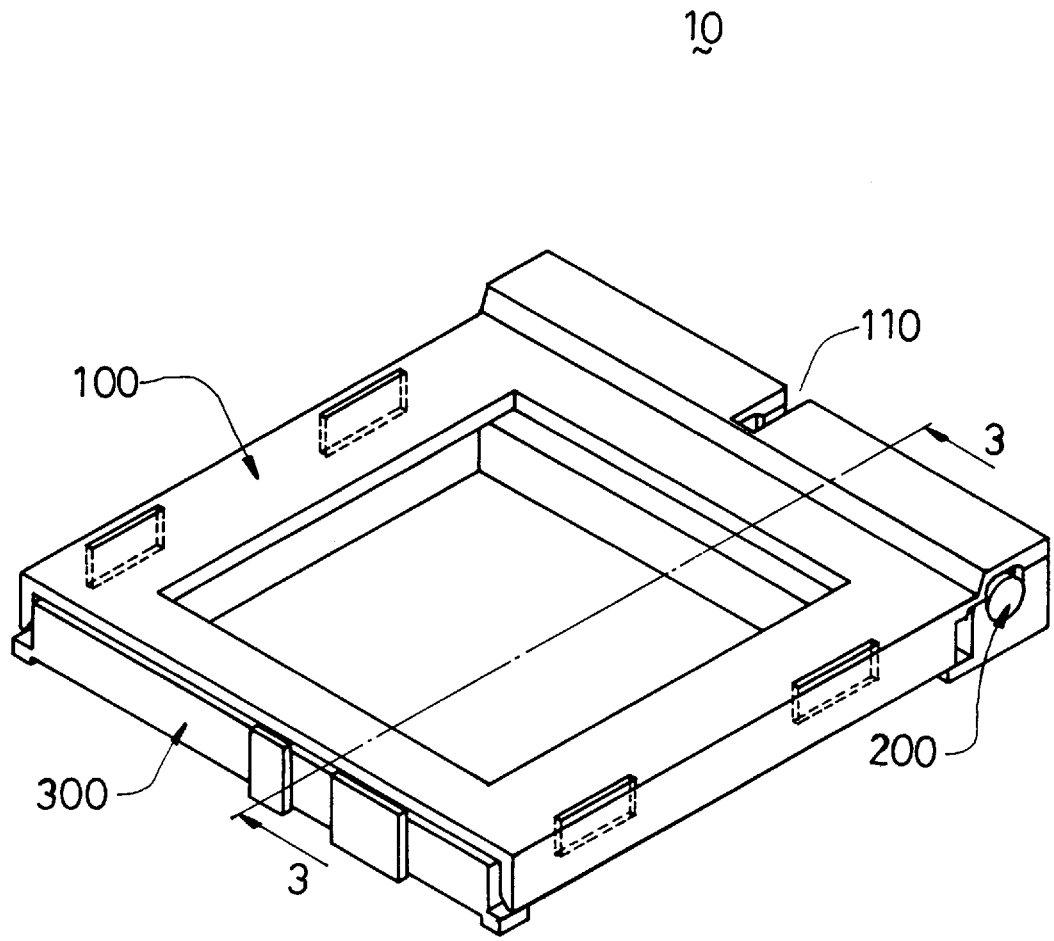
FIG. 1 is a perspective view of a presently preferred embodiment of an assembled ZIF connector, according to the invention.
Figure 2:
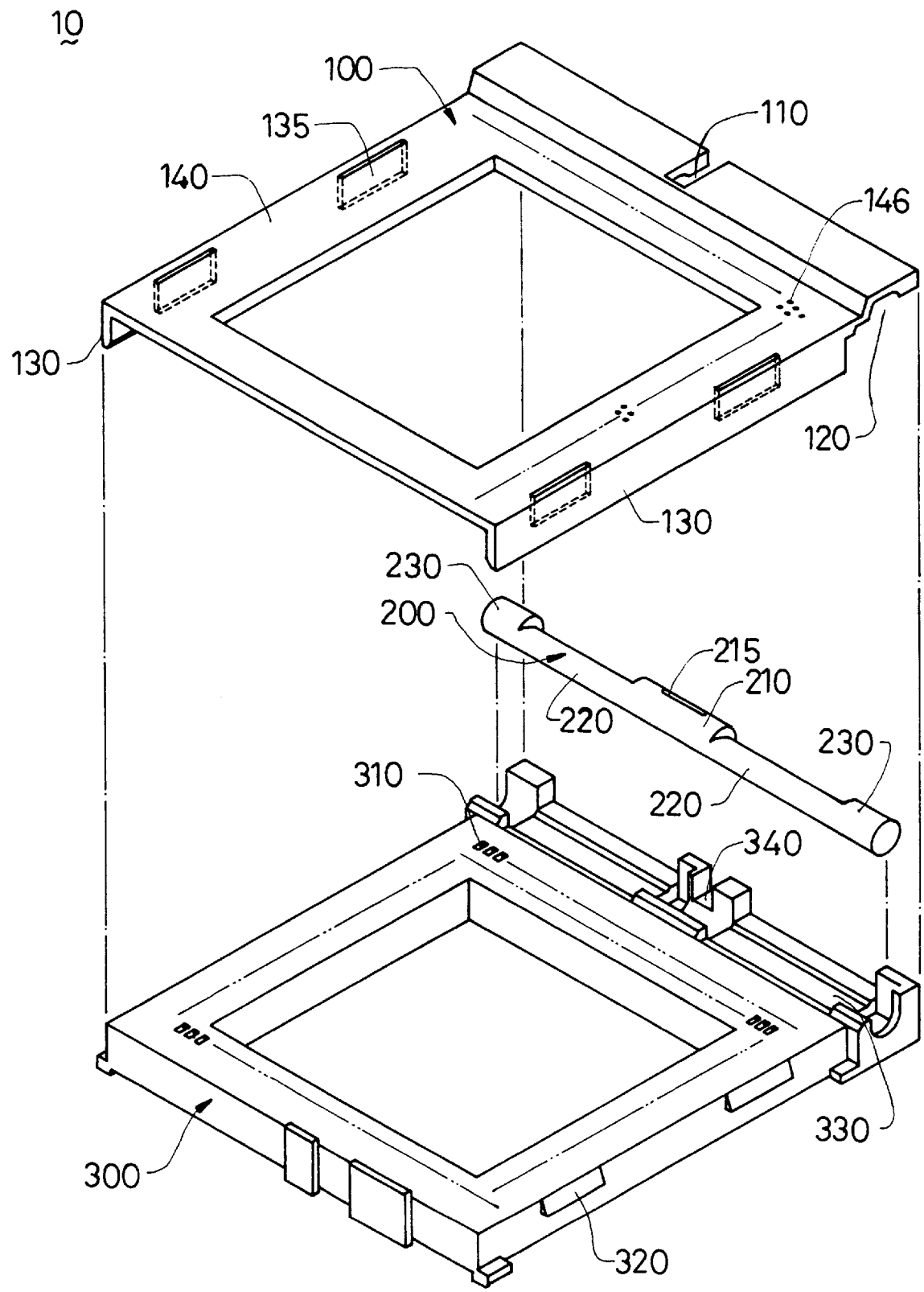
FIG. 2 is an exploded view of the connector of FIG. 1.

References will now be in detail to the preferred embodiments of the invention. While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

It will be noted here that for a better understanding, most of like components are designated by like reference numerals throughout the various figures in the embodiments. Attention is directed to FIGS. 1–4 wherein the subject ZIF connector 10 includes a cover 100, an actuation device 200 and a base 300.

The cover 100 includes a plate 140 with a plurality of first passageways 146 extending therethrough, and a first opening 110 disposed on an edge of said plate 140. Formed on an undersurface is a reversed U-shaped first slot 120 whereby the first opening 110 communicates with the first slot 120. A pair of side walls 130 are disposed on two sides of the plate 120 wherein each side wall 130 has a cavity 135 on the interior surface.

The actuation device 200 includes a center rotation section 210, two end rotation sections 230, and two cam sections 220 each positioned between the center rotation section 210 and the corresponding end rotation section 230. The center rotation section 210 includes an engagement slot 215 in alignment with the first opening 110 of the cover 100 for insertion of an external tool. In this embodiment, such engagement slot 215 is of a slit type so as to cooperate with a flat type screw driver. More than one used engagement slot 215 may be more than one. For example, several engagement slots 215 may be arranged around the circumference of the center rotation section 210, such as a first engagement slot aligned with the first opening 110 of the cover 100 and a second engagement slot (not shown) aligned with a seond opening 340 of the base 300.

The base 300 has a structure similar to the cover 100, including a plurality of second passageways 310 in alignment with the first passageways 146, respectively wherein each of the second passageways 310 has a contact (not shown) therein. Corresponding to the first slot 120 and the first opening 110 of a cover 1001, the base 300 includes the second slot 330 and a second opening 340 wherein the second opening 340 extends through the second slot 330 and communicates with the exterior. Disposed on two sides of the base 300 are two elongate, respectively, blocks 320 wherein each block 320 has a dimension than the cavity 135 in the cover 100.

Therefore, the cover 100, the actuation device 200 and base 300 can be assembled as shown in FIG. 1. The steps are as follows:

The actuation device 200 is positioned within the slot 330 of the base 300, and the cover 100 is attached to the base 300 by engagement of the blocks 320 of the base 300 with the cavities 135 of the cover 100, thus sandwiching the actuation device 200 therebetween. Because the block 320 has a smaller lengthwise dimension than the cavity 135, the cover 100 may move horizontally along the top surface of the base 300 by a predetermined distance. Simultaneously, the engagement slot 215 of the actuation device 200 may move from the top of the first opening 110 of the cover 100 to the back of the second opening 340 of the base 300.

Figure 3:
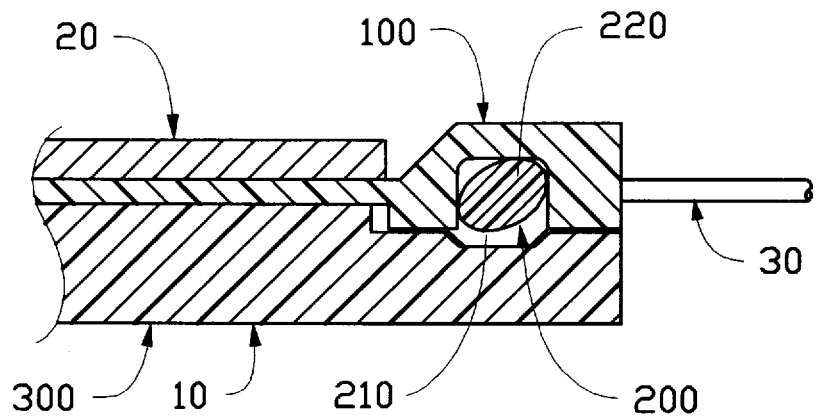
FIG. 3 is a cross-sectional view of the connector of FIG. 1 along line 3—3 showing the connector in an open state.
Figure 4:
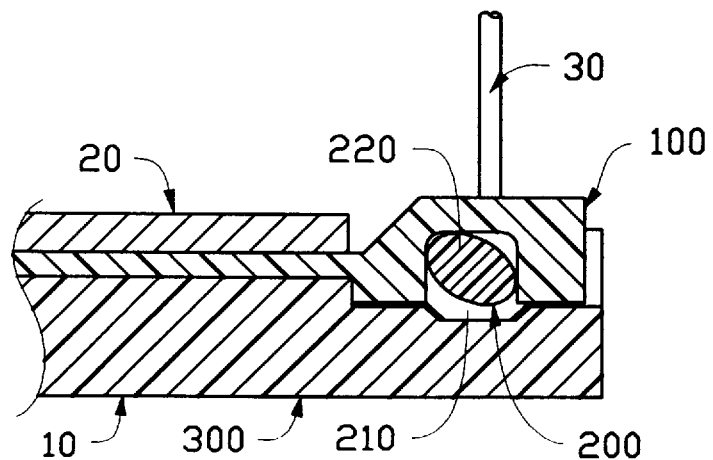
FIG. 4 is a cross-sectional view of the connector of FIG. 1 along line 3—3 showing the connector in a locked state.

Please refer to FIGS. 3 and 4, wherein FIG. 3 shows the engagement slot 215 of the actuation device 200 positioned at a zero degree position (based on a right horizontal plane of the base 300), for allowing an external tool 30 to be inserted into the engagement slot 215 from the second opening 340. Therefore, the CPU component 20 can be attached to the connector 10 with a zero insertion force. Successively, if the external tool 30 is rotated counterclockwise and reaches a ninety degree position, i.e. the position about the first opening 110 (FIG. 4), the cam section 220 rotates and pushes the cover 100 to move on the base 300 in a horizontal direction, thus resulting in the pins of the component 20 engaging the corresponding contacts mechanically and electrically, and being sandwiched by the contacts. When the engagement of the pins of the component and the corresponding contacts of the connector is complete, the external tool 30 may be removed from the connector 10.

In contrast, if the component 20 is intended to be removed from the connector 10, the tool 30 should be inserted into the engagement slot 215 from the first opening 110, and rotated clockwise to the zero degree position, and then the tool 30 can be removed from the connector 100, thus releasing the engagement between the pins of the component 20 and the contacts of the connector 10.

An additional feature of the present invention may reduce the rotation angle of the actuation device 200 for convenience of the operator. Also, the cross-section of the cam section may be reshaped to reduce the rotation path of the actuation device 200, for example, the range of the rotation angle being between 90 degrees and 60 degrees.

In conclusion, the improved mechanism of the subject ZIF connector allows use of an external tool to actuate the connector 10 for engagement or disengagement with or from the corresponding component. Such external tool may be removed from the connector once such engagement or disengagement has been completed.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A connector for use with an electrical component comprising:

a cover having a plurality of first passageways and a first opening defined in a first edge thereof;

a base adapted to be slidably attached to the cover, said base including a plurality of second passageways in alignment with the first passageways, respectively, each of said second passageways including a contact for electrical and mechanical engagement with a corresponding pin of said component and the base defining a second opening at an edge thereof substantially communicating with the first opening of the cover; and an actuation device being rotatably received between the attached cover and base and including a center rotation section, two cam sections connected to two ends of the center rotation section, and at least an engagement slot defined on a circumferential periphery of the center rotation section of the actuation device for reception of an external tool and actuation thereby within a 90 degree range so as to move the cover via the two cam sections in a horizontal direction with regard to the base.

2. The connector as claimed in claim 1 further comprising a first slot formed in an underface of the cover communicating with the first opening and a second slot formed in the base communicating with the second opening, and rotatably sandwiching the actuation device between the first slot of the cover and the second slot of the base.

3. The connector as claimed in claim 2, wherein the cover comprises two side walls extending downward from two sides thereof and respectively defining at least one recess in an interior surface of each side wall thereof, and the base has at least one block formed on each of two side walls for slidable reception in the corresponding at least one recess of each side wall of the cover.

4. The connector as claimed in claim 1, wherein the actuation device further comprises two end rotation sections respectively connected to the two cam sections for facilitating rotation of the actuation device upon operation of the external tool.

\* \* \* \* \*